(12) United States Patent
Woo et al.

(10) Patent No.: US 9,748,901 B2
(45) Date of Patent: Aug. 29, 2017

(54) POWER AMPLIFYING APPARATUS

(71) Applicant: Avago Technologies General IP (Singapore) Pte. Ltd., Singapore (SG)

(72) Inventors: Jung-Rin Woo, Seoul (KR); Sung-Hwan Park, Seoul (KR); Jung-Hyun Kim, Uiwang (KR); Young Kwon, Thousand Oaks (KR)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/741,371

(22) Filed: Jun. 16, 2015

(65) Prior Publication Data
US 2016/0373067 A1 Dec. 22, 2016

(51) Int. Cl.
| | |
|---|---|
| H03G 3/20 | (2006.01) |
| H03F 1/02 | (2006.01) |
| H03F 3/19 | (2006.01) |
| H03F 3/21 | (2006.01) |
| H03F 3/387 | (2006.01) |

(52) U.S. Cl.
CPC ............ H03F 1/0222 (2013.01); H03F 3/19 (2013.01); H03F 3/211 (2013.01); H03F 3/387 (2013.01); *H03F 2200/102* (2013.01); *H03F 2200/451* (2013.01); *H03F 2200/546* (2013.01)

(58) Field of Classification Search
CPC ...... H03F 1/3247; H03F 3/21; H03F 3/45179; H03F 3/193; H03F 2200/102; H03F 2201/3227; H04B 1/62
USPC ..... 330/10, 124 R, 127, 131, 136, 253, 295, 330/296; 323/311; 375/297; 455/114.2, 455/114.3, 115.1, 127.1, 572
See application file for complete search history.

(56) References Cited

U.S. PATENT DOCUMENTS

| | | | |
|---|---|---|---|
| 7,888,997 B2 | 2/2011 | Woo et al. | |
| 8,159,296 B2 | 4/2012 | Krvavac et al. | |
| 2004/0061555 A1* | 4/2004 | Lynch | H03F 1/0222 330/136 |
| 2011/0031953 A1 | 2/2011 | Kanbe et al. | |
| 2011/0279179 A1 | 11/2011 | Vice | |
| 2012/0183105 A1 | 7/2012 | Thelen et al. | |
| 2014/0009232 A1 | 1/2014 | Jeon et al. | |
| 2014/0049322 A1 | 2/2014 | Jeon et al. | |
| 2014/0100002 A1 | 4/2014 | Dupuis et al. | |

(Continued)

OTHER PUBLICATIONS

Bruss, "Linearization Methods", Apr. 23, 2003.
(Continued)

*Primary Examiner* — Steven J Mottola
*Assistant Examiner* — Hafizur Rahman (57) ABSTRACT

A power amplifying apparatus includes a radio frequency (RF) power amplifier, a supply modulating unit, a phase shifting unit, and an envelope shaping unit. The RF power amplifier receives an input RF signal and outputs an amplified RF signal. The supply modulating unit provides the RF power amplifier with a supply voltage which varies with an original envelope of the input RF signal. The phase shifting unit receives a control signal and shifts a phase of the input RF signal to be inputted to the RF power amplifier by a shift amount which varies with the control signal. The envelope shaping unit receives the original envelope and provides the phase shifting unit with the control signal which varies with the original envelope.

18 Claims, 5 Drawing Sheets

(56) References Cited

U.S. PATENT DOCUMENTS

2014/0138746 A1    5/2014  Abrokwah et al.
2015/0031318 A1*   1/2015  McCallister .......... H03F 1/3247
                                                            455/114.3
2015/0091649 A1    4/2015  Jeon et al.
2015/0214908 A1    7/2015  Kim et al.

OTHER PUBLICATIONS

Kim, et al. "A CMOS Envelope-Tracking Transmitter With an On-Chip Common-Gate Voltage Modulation Linearizer", IEEE Microwave and Components Letters, vol. 24, No. 6, Jun. 2014.

Kim, et al. "A High Efficiency SOI CMOS Stacked-FET Power Amplifier Using Phase-Based Linearization", IEEE Microwave and Components Letters, vol. 24, No. 12, Dec. 2014.

Jin, et al. "CMOS Saturated Power Amplifier With Dynamic Auxiliary Circuits for Optimized Envelope Tracking", IEEE Transactions on Microwave Theory and Techniques, vol. 62, No. 12, Dec. 2014.

Woo, et al. "Dynamic Stack-Controlled CMOS RF Power Amplifier for Wideband Envelope Tracking", IEEE Transactions on Microwave Theory and Techniques, vol. 62, No. 12, Dec. 2014.

* cited by examiner

POWER AMPLIFYING APPARATUS

BACKGROUND

Dynamic bias control techniques such as envelope tracking (ET) or envelope elimination and restoration (EER) are applied to the design of a radio frequency (RF) power amplifier to enhance its efficiency. In such case, securing a linearity of the RF power amplifier may become another design concern. For instance, the dynamic bias controlled power amplifier may suffer from a gain distortion in an output RF signal, which needs to be suppressed in order to secure the required linearity. Further, although the gain distortion may be resolved by a specific device or method, it does not guarantee the required linearity unless a phase distortion in the output RF signal is removed or bounded within a specific range.

What is needed, therefore, is an apparatus that overcomes at least the shortcomings of the known RF power amplifier discussed above.

BRIEF DESCRIPTION OF THE DRAWINGS

The exemplary embodiments may be best understood from the following detailed description when read with the accompanying drawing figures. It should be noted that the various features are not necessarily drawn to scale. In fact, the dimensions are sometimes arbitrarily increased or decreased for clarity of discussion. Wherever applicable and practical, like reference numerals refer to like elements.

DETAILED DESCRIPTION

In the following detailed description, for purposes of explanation but not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices.

Although the terms "first", "second", etc. may be used herein to describe various elements, these elements should not be limited by these terms. These terms are used to distinguish one element from another. For example, a first element could be termed a second element, and, similarly, a second element could be termed a first element, without departing from the scope of the present teachings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Hereinafter, power amplifying apparatuses and preprocessor modules used therein in accordance with the present disclosure are explained with reference to corresponding drawings.

The preprocessor modules in accordance with the present disclosure may include at least a part of power amplifying apparatuses in accordance with the present disclosure except for a core power amplifier thereof. Such part may include one or more elements for shaping an envelope of an input RF signal. For the sake of convenience, the explanation of the elements of the preprocessor modules will be omitted as long as they are also the elements of the power amplifying apparatuses in accordance with the present disclosure.

For the sake of convenience, embodiments are explained based on the dynamic bias controlled power amplifiers such as the ET power amplifiers and the EER amplifiers. However, it will be understood that the present disclosure is related to techniques which can be generally applied to RF power amplifiers with or without a dynamic controlled supply voltage.

Figure 1:
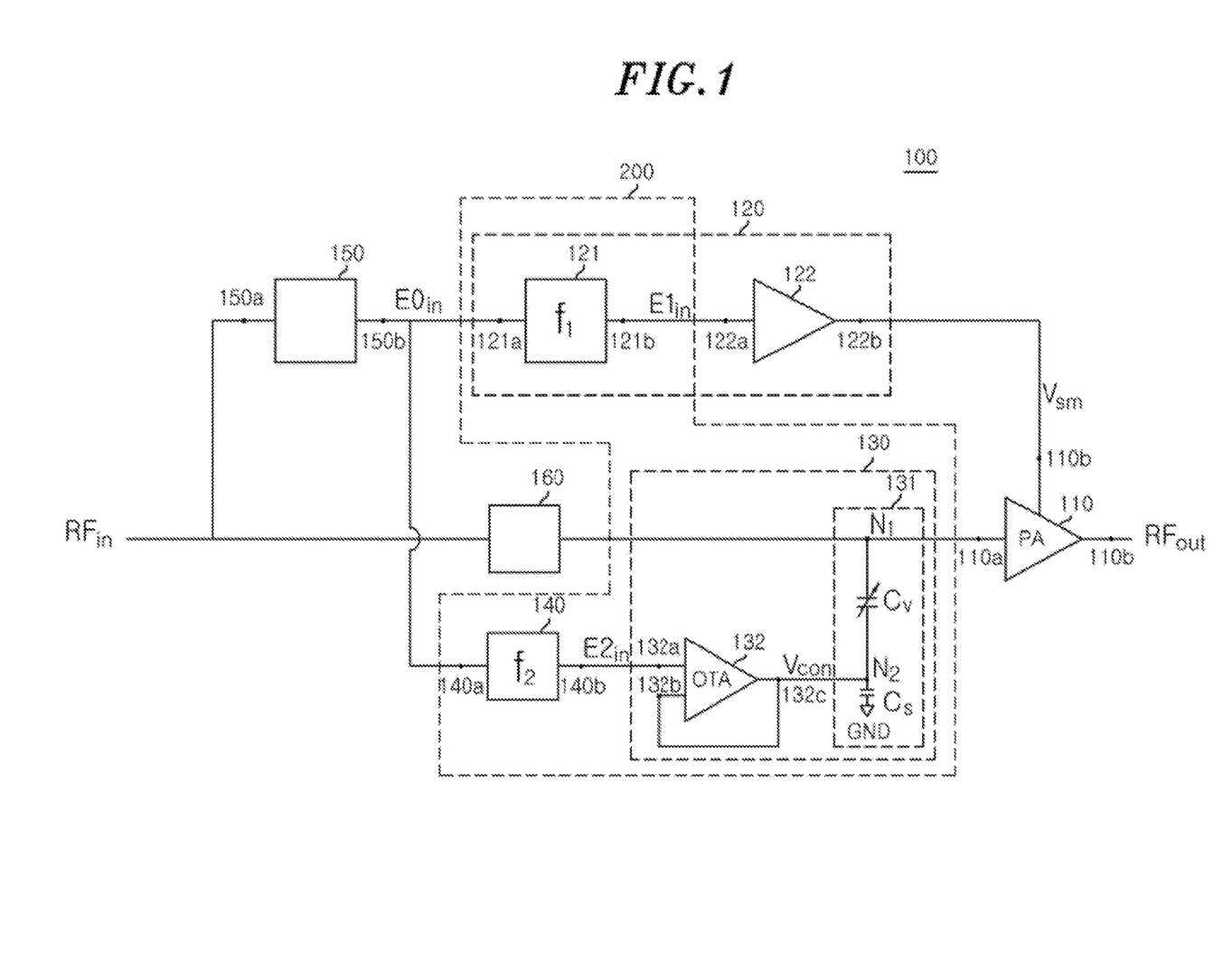
FIG. 1 shows a power amplifying apparatus in accordance with an embodiment.

FIG. 1 shows a power amplifying apparatus in accordance with an embodiment.

As illustrated in FIG. 1, the power amplifying apparatus 100 may include a radio frequency (RF) power amplifier 110, a supply modulating unit 120, a phase shifting unit 130, and an envelope shaping unit 140.

The RF power amplifier 110 serves as a core of the power amplifying apparatus 100. A first input port 110a of the RF power amplifier 110 is electrically connected to the phase shifting unit 130. A second input port 110b of the RF power amplifier 110 is electrically connected to the supply modulating unit 120. The RF power amplifier 110 is configured to receive an input RF signal $RF_{in}$ via the first input port 110a and to output via its output port 110c an amplified RF signal as an output RF signal $RF_{out}$. The RF power amplifier 110 may be implemented by using a transistor such as a field effect transistor (FET), a bipolar junction transistor (BJT), and the like as a switching element. In certain embodiments, the RF power amplifier 110 may have a known structure. However, the present teachings are not limited thereto.

The supply modulating unit 120 may be configured to receive an original envelope $E0_{in}$ of the input RF signal $RF_{in}$. The supply modulating unit 120 is configured to provide the RF power amplifier 110 with a supply voltage $V_{sm}$. In accordance with the embodiment, the supply modulating unit 120 is configured such that the supply voltage $V_{sm}$ from the supply modulating unit 120 may vary with the original envelope $E0_{in}$ of the input RF signal $RF_{in}$. The supply modulating unit 120 enables the power amplifying apparatus 100 to operate as the dynamic bias controlled power amplifier, e.g., the envelope tracking (ET) power amplifier.

The supply modulating unit 120 may include an envelope shaping unit 121 and a supply modulator 122. (Hereinafter, the envelope shaping units 121 and 140 may also be referred to as a first envelope shaping unit 121 and a second envelop shaping unit 140, respectively, in order to distinguish them with ease.)

The first envelope shaping unit 121 has an input port 121a via which the original envelope $E0_{in}$ is received. An output port 121b of the first envelope shaping unit 121 is electrically connected to an input port 122a of the supply modulator 122. The first envelope shaping unit 121 is configured to modify the original envelope $E0_{in}$ and to output a modified envelope $E1_{in}$ via the output port 121b thereof. The operation performed by the first envelope shaping unit 121 may be related with a gain trajectory of the overall power amplifying apparatus 100. In this respect, the operation may be called a gain shaping. In accordance with the embodiment, an envelope shaping function for the gain shaping be defined and performed by the first envelope shaping unit 121. The detailed operation of the first envelope shaping unit 121 will be explained later.

In certain embodiments, the first envelope shaping unit 121 may be a mapping table which stores a plurality of modified envelope values respectively corresponding to a plurality of envelope values. In certain embodiments, the first envelope shaping unit 121 may be a calculator which is configured to generate the modified envelope $E1_{in}$ based on the original envelope $E0_{in}$ and a preset formula. In certain embodiments, the first envelope shaping unit 121 may be a signal generator. Basically, an arbitrary known signal generator can be the signal generator for the first envelope shaping unit 121. However, the present teachings are not limited thereto. Such signal generator may serve as the mapping table and/or the calculator. A processor, a memory, a storage device, and/or a program may be used to the implementation of the mapping table, calculator, and/or the signal generator.

The supply modulator 122 is configured to receive the modified envelope $E1_{in}$ via the input port 122a thereof and to output the supply voltage $V_{sm}$ as a drain bias (or collector bias) for the RF power amplifier 110. The supply voltage $V_{sm}$ is transmitted via an output port 122b of the supply modulator 122 and the second input port 110b of the RF power amplifier 110. The supply modulator 122 serves as an element for varying the supply voltage $V_{sm}$ and thereby implementing the dynamic bias control technique. In certain embodiments, the supply modulator 122 may have a known structure. However, the present teachings are not limited thereto.

The phase shifting unit 130 is configured to receive a control signal and to shift (e.g., delay) a phase of the input RF signal $RF_{in}$, which is to be inputted to the RF power amplifier, by a shift amount. The input RF signal $RF_{in}$ whose phase may be delayed is outputted from the phase shifting unit 130 and transmitted to the first input port 110a of the RF power amplifier 110. In accordance with the embodiment, the shift amount may vary with the control signal. The control signal may be a modified envelope $E2_{in}$, which will be explained later. (The modified envelopes $E1_{in}$ and $E2_{in}$ may also be referred to as a first modified envelope $E1_{in}$ and a second modified envelope $E2_{in}$, respectively, in order to distinguish them.)

The phase shifting unit 130 may include variable phase delayer 131. In certain embodiments, the phase shifting unit 130 may further include an operational transconductance amplifier (OTA) 132.

The variable phase delayer 131 is configured to delay the phase of the input RF signal $RF_{in}$. In accordance with the embodiment, the variable phase delayer 131 may include a first node $N_1$, a second node $N_2$, a varactor $C_v$, and an RF bypass capacitor $C_s$.

The first node $N_1$ is defined on an electrical path via which the input RF signal $RF_{in}$ is transmitted, and the second node $N_2$ is defined on an electrical path via which a control voltage $V_{con}$ from the OTA 132 is transmitted. The varactor $C_v$ is connected between the first node $N_1$ and the second node $N_2$. The varactor $C_v$ has a capacitance which may vary with the control voltage $V_{con}$. The RF bypass capacitor $C_s$ is connected between the second node $N_2$ and the ground GND. In other words, the varactor $C_v$ and the RF bypass capacitor $C_s$ are serially connected between the first node $N_1$ and the ground GND, and the second node $N_2$ is defined on an electrical path between the varactor $C_v$ and the RF bypass capacitor $C_s$.

In the configuration stated above, the equivalent capacitance of the variable phase delayer 131 is controlled by the control voltage $V_{con}$ of the OTA 132 so that it can give adaptive phase delay while referring to the control signal (i.e., the second modified envelope $E2_{in}$). The RF bypass capacitor $C_s$ is provided to suppress the RF voltage swing on the electrical path between an output port 132c of the OTA 132 and the second node $N_2$. The second node $N_2$ serves to transmit the control voltage $V_{con}$ for varying the shift amount of the input RF signal $RF_{in}$ to the variable phase delayer 131, and the first node $N_1$ serves to transmit the input RF signal $RF_{in}$ having a shifted (or e.g., delayed) phase to the RF power amplifier 110.

The OTA 132 may include an input port 132a and the output port 132c. The OTA 132 is configured to receive the control signal from the second envelope shaping unit 140 via the input port 132a and to provide the variable phase delayer 131 with the control voltage $V_{con}$. In accordance with the embodiment, the OTA 132 may further include an additional input port 132b which is electrically connected to the output port 132c of the OTA 132.

Meanwhile, the second envelope shaping unit 140 is configured to receive the original envelope $E0_{in}$ via an input port 140a thereof and to provide the phase shifting unit 130 with the second modified envelop $E2_{in}$. The second modified envelop $E2_{in}$ is transmitted via an output port 140b of the second envelope shaping unit 140 as the control signal for the phase shifting unit 130. In accordance with the embodiment, the second envelope shaping unit 140 is configured such that the second modified envelop $E2_{in}$ (i.e., the control signal) may vary with the original envelope $E0_{in}$.

The operation performed by the second envelope shaping unit 140 may be related with a phase trajectory of the overall power amplifying apparatus 100. In this respect, the operation may be called a phase shaping. In accordance with the embodiment, an envelope function for the phase shaping be defined and performed by the second envelope shaping unit 140. The detailed operation of the second envelope shaping unit 140 will be explained later.

The power amplifying apparatus and the preprocessor module in accordance with the present disclosure may have a structure which enables the phase shaping to be performed independently from the operation of the core RF power amplifier and/or the gain shaping. For instance, the second envelope shaping unit 140 as shown in FIG. 1 is configured to generate the control signal independently from the amplified RF signal $RF_{out}$, the supply voltage $V_{sm}$, and/or the first modified envelope $E1_{in}$ while the power amplifying apparatus 100 is functioning.

Similarly to the first envelope shaping unit 121, the second envelope shaping unit 140 may be a mapping table which stores a plurality of control signal values respectively corresponding to a plurality of envelope values. In certain embodiments, the second envelope shaping unit 140 may be a calculator which is configured to generate the control signal based on the original envelope $E0_{in}$ and a preset formula. In certain embodiments, the second envelope shaping unit 140 may be a signal generator. Basically, an arbitrary known signal generator can be the signal generator for the second envelope shaping unit 140. However, the present teachings are not limited thereto. Such signal generator may serve as the mapping table and/or the calculator. A processor, a memory, a storage device, and/or a program may be used to the implementation of the mapping table, calculator, and/or the signal generator. In certain embodiment, the first envelope shaping unit 121 and the second envelope shaping unit 140 may be implemented by using a same device or a plurality of devices having identical structures.

Among the elements explained above, one or more elements may constitute the preprocessor module in accordance with the embodiment. For example, the preprocessor module 200 for an ET power amplifier (which may include the RF power amplifier 110 and the supply modulator 122) may include the first envelope shaping unit 121, the phase shifting unit 130, and the second envelope shaping unit 140. The configurations and the operations of these elements in the preprocessor module are basically same as explained above.

In addition, the power amplifying apparatus and the preprocessor module in accordance with the present disclosure may further include one or more additional elements.

For instance, as illustrated in FIG. 1, an envelope output unit 150 for providing the original envelope $E0_{in}$ from the input RF signal $RF_{in}$ may connected to the input port 121a of the first envelope shaping unit 121 and/or the input port 140a of the second envelope shaping unit 140. The envelope output unit 150 may have a input port 150a for receiving the input RF signal $RF_{in}$ and an output port 150b for outputting the original envelope $E0_{in}$. The envelope output unit 150 may be a known envelope detector or a known signal generator. However, the present teachings are not limited thereto.

Also, as shown in FIG. 1, the power amplifying apparatus 100 or the preprocessor module 200 may further include an impedance matching network 160 which may be distinct from the phase shifting unit 130. The impedance matching network 160 may be provided to an input of the phase shifting unit 130 as illustrated in FIG. 1. However, in certain embodiments, the impedance matching network may be provided between an output of the phase shifting unit and the first input port of the RF power amplifier.

Hereinafter, the operations of the envelope shaping units in accordance with the embodiment are explained with reference to FIGS. 2 to 5.

Figure 2:
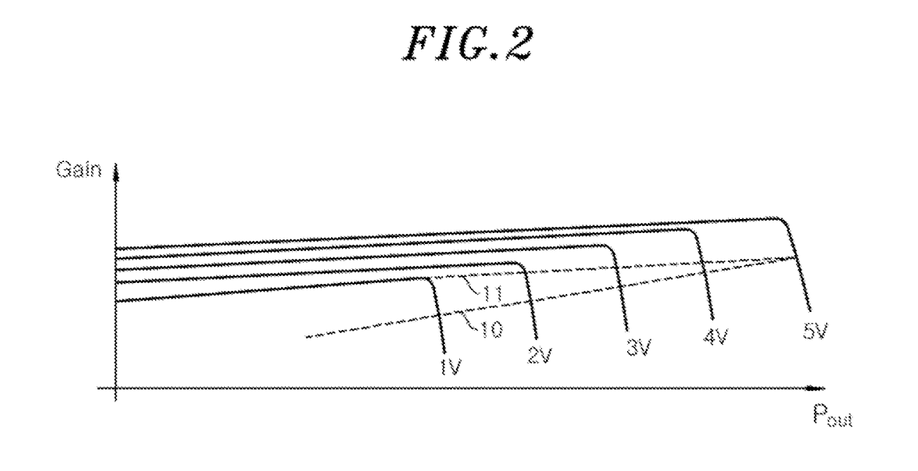
FIG. 2 is a graph indicating a relationship between the power of an output RF signal and the gain of an RF power amplifier, and gain trajectories of a supply modulated power amplifier with and without envelope shaping.

FIG. 2 is an exemplary graph indicating a relationship between the power of the output RF signal and the gain of the RF power amplifier, and gain trajectories of a supply modulated power amplifier with and without envelope shaping. In FIG. 2, the curves correspond to the cases where the drain bias (or collector bias) for the RF power amplifier is set to 1 volt, 2 volt, 3 volt, 4 volt, and 5 volt, respectively, and the dashed lines 10, 11 indicate the gain trajectories.

Referring to FIG. 2, comparisons of the curves reveal that the gain of the RF power amplifier may be relatively low in a lower drain bias (or collector bias) region due to a low transconductance of a transistor used to implementation of the RF power amplifier. Consequently, as depicted by the dashed line 10, the gain trajectory of the overall supply modulated power amplifier without envelop shaping may become slanted and show gain distortion (e.g., gain expansion), which results in degraded linearity. For instance, when a CMOS FET is used as a core of the RF power amplifier, the linearity of the entire system may be significantly degraded, since the CMOS FET tends to have relative large knee voltage where the nonlinear capacitance varies sharply. Moreover, this problem may be more pronounced in a cascode or a multiple FET stacking structure which are commonly used in the designing the CMOS RF power amplifier.

Further, the respective curves in FIG. 2 also show that a gain collapse occurs at a specific threshold output power, which tends to decrease as the drain bias (or collector bias) decreases. That is, gain collapse may occur more easily in the lower drain bias (or collector bias) region.

Furthermore, in certain embodiments, when a magnitude of an input signal (e.g., an envelope) received by the supply modulator becomes equal to or lower than a specific value (e.g., when the magnitude becomes zero), the supply modulator may output a very weak voltage or zero volt as the drain bias (or collector bias), which causes turn-off of a switching element (e.g., a transistor) in the RF power amplifier.

In order to resolve the aforementioned phenomena, the first envelope shaping unit 121 as illustrated in FIG. 1 may perform an envelope shaping function for efficiency, linearity, and/or normal operation of the RF power amplifier 110. As shown above, the value of the drain bias (or collector bias) may determine the gain of the RF power amplifier. Meanwhile, in accordance with the embodiment, the value of the supply voltage can be controlled by varying the magnitude of an input received by the supply modulator. Accordingly, by setting a modified value with respect to a specific value of original envelope, a desired gain can be obtained. Further, based on a plurality of modified values with respect to a specific range of the original envelope, an envelope shaping function $f_1: E0_{in}(t) \rightarrow E1_{in}(t)$ for obtaining a modified envelope can be defined in an appropriate manner, e.g., by experiment.

Figure 3:
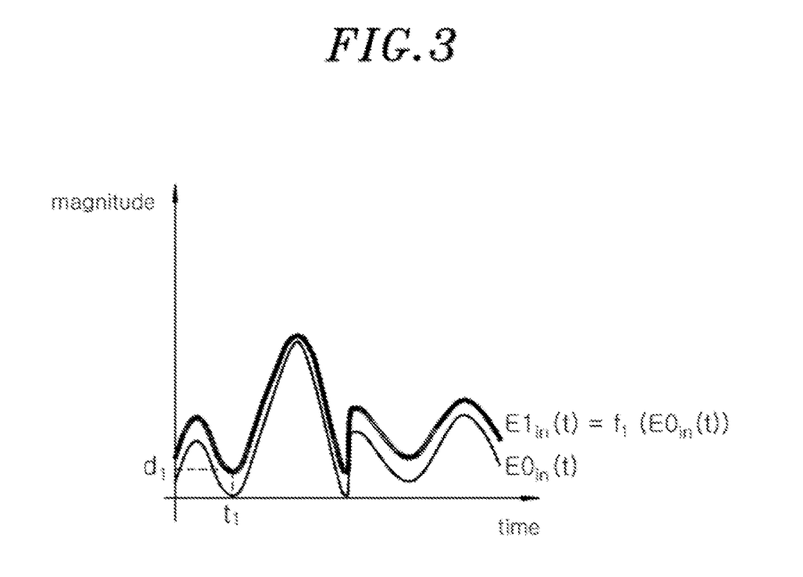
FIG. 3 provides a graph showing an envelope shaping function performed by a first envelope shaping unit in accordance with the embodiment, and a relationship between an original envelope and a first modified envelope obtained based on the envelope shaping function.

FIG. 3 depicts an exemplary graph showing the envelope shaping function performed by the first envelope shaping unit in accordance with the embodiment, and a relationship between the original envelope and the first modified envelope obtained based on the envelope shaping function.

Referring to FIG. 3, the envelope shaping function $f_1$ used in the first envelope shaping unit may obtain a waveform $E1_{in}(t)$ of the modified envelope by, e.g., detroughing the original envelope. Specifically, the first envelope shaping unit may monitor a waveform $E0_{in}(t)$ of the original envelope and generate the modified envelope by increasing a magnitude of at least a part of the original envelope, e.g., a portion at $t_1$ where the magnitude becomes zero, by a preset offset $d_1$ based on the envelope shaping function $f_1$. In certain embodiments, the envelope shaping function $f_1$ may be a simple offset function typically used to detroughing. However, the present teachings are not limited thereto. In addition, the envelope shaping function $f_1$ may be defined by using a specific formula, a table, and the like as occasion demands.

By increasing the magnitude of at least the part of the original envelope in accordance with the envelope shaping function $f_1$, the gain distortion can be compensated, and a desired (e.g., flat) gain trajectory such as a dashed line 11 in FIG. 2 may be obtained. Further, applying the envelope shaping function $f_1$ such that a magnitude of the modified envelope does not become lower than specific values, may serve to prevent the gain collapse and/or the turn-off of the switching element in the RF power amplifier. Accordingly, linearity and/or normal operation of the RF power amplifier 110 may be enhanced.

Meanwhile, the second envelop shaping unit in accordance with the embodiment may perform an envelope shaping function $f_2 : E0_{in}(t) \rightarrow E2_{in}(t)$ for compensating a phase distortion and thereby obtaining a desired phase trajectory of the power amplifying apparatus, which will be explained hereinafter.

Figure 4A:
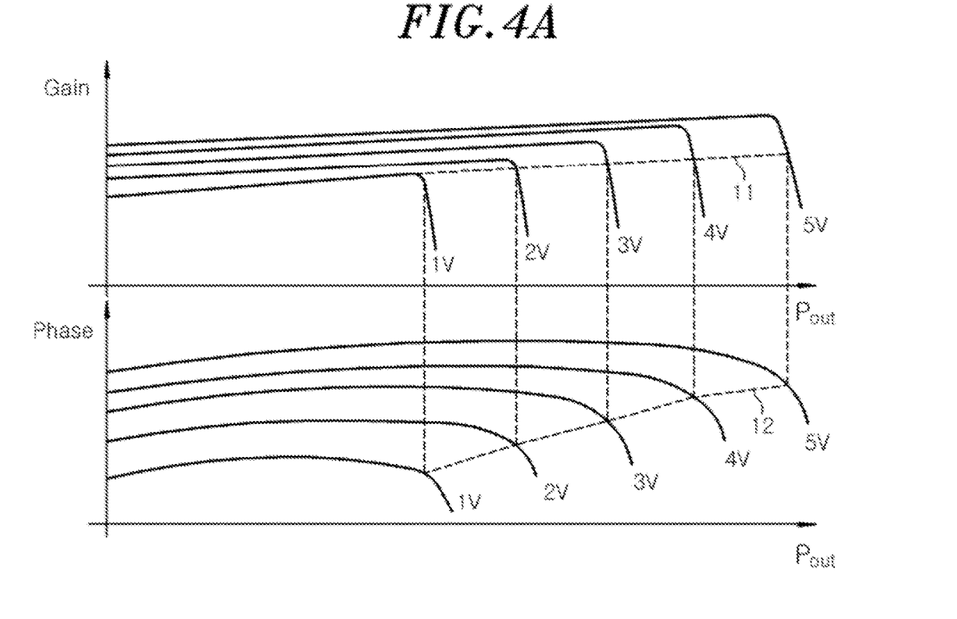
FIG. 4A represents a graph indicating a relationship between a gain trajectory and a phase trajectory of a power amplifying apparatus in accordance with the embodiment when a second envelope shaping unit is not operative.

FIG. 4A illustrates an exemplary graph indicating a relationship between the gain trajectory and the phase trajectory of the power amplifying apparatus in accordance with the embodiment when the second envelope shaping unit is not operative.

As shown in FIG. 4A, even if the gain trajectory of the power amplifying apparatus is flattened by e.g., the first envelope shaping unit in accordance with the embodiment, it does not guarantee a desired phase trajectory, and under the settings of the supplied voltage for the gain compensation, a corresponding phase trajectory may become slanted and show a phase distortion as depicted by a dashed line 12. This may be due to a non-linear junction capacitance of a switching element (e.g., a transistor) in the RF power amplifier.

However, such phase trajectory indicated by the dashed line 12 also gives information on a shift amount of the phase which is necessary for compensating the phase distortion and thereby obtaining a desired phase trajectory. Since the dashed line 11 (indicative of a gain trajectory) was obtained by a function (e.g., the envelope shaping function $f_1$) applied to the original envelope $E0_{in}$, it can be understood that not only the supply voltage but also the resultant phase delay and the necessary shift amount for compensating the phase distortion can be defined for the respective magnitude values of the original envelope $E0_{in}$.

Consequently, in accordance with the embodiment, an envelope shaping function $f_1$ which determines values of the control signal (i.e., the second modified envelope $E2_{in}$) for obtaining the desired shift amount for a specific magnitude value of the original envelope $E0_{in}$, can be defined in an appropriate manner, e.g., by experiment.

Figure 5:
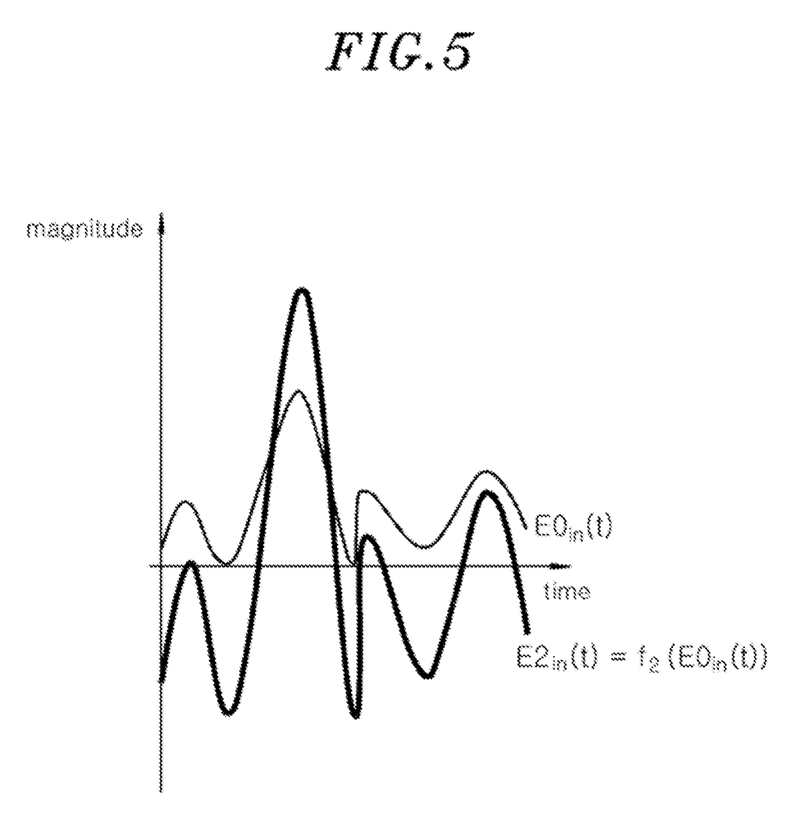
FIG. 5 offers a graph showing an envelope shaping function performed by the second envelope shaping unit in accordance with the embodiment, and a relationship between an original envelope and a second modified envelope obtained based on the envelope shaping function.

FIG. 5 is an exemplary graph showing an envelope shaping function $f_2$ performed by the second envelope shaping unit in accordance with the embodiment, and a relationship between the original envelope $E0_{in}$ and the second modified envelope $E2_{in}$ obtained based on the envelope shaping function $f_2$. The envelope shaping function $f_2$ may be defined by using a specific formula and/or a table as occasion demands.

Figure 4B:
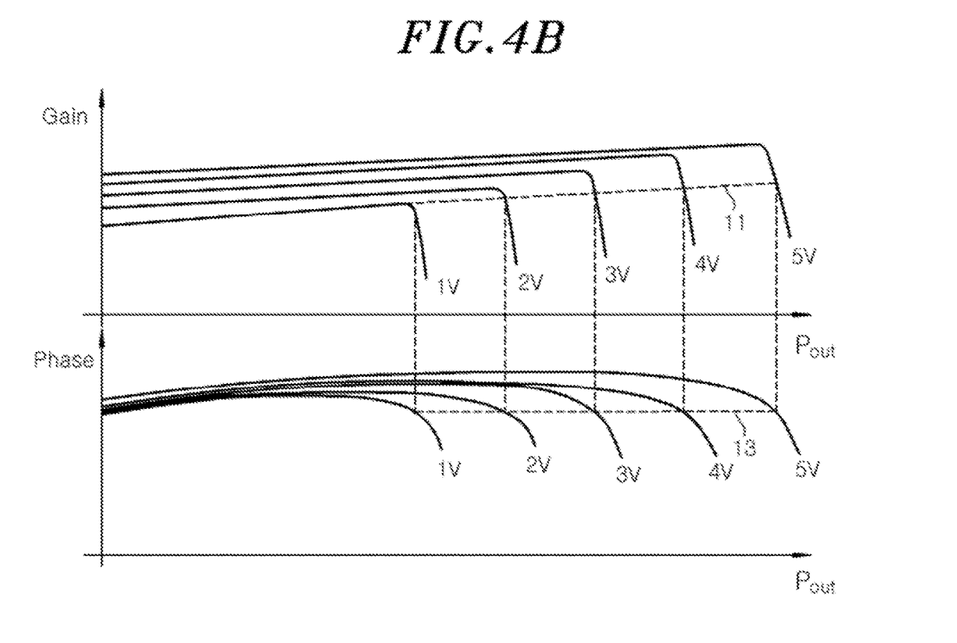
FIG. 4B presents a graph indicating a relationship between a gain trajectory and a phase trajectory of the power amplifying apparatus in accordance with the embodiment when the second envelope shaping unit is operative.

By applying the envelope shaping function $f_2$, the curves in FIG. 4A indicating the relationship between the power $P_{out}$ of the amplified RF signal and the phase are shifted as illustrated in FIG. 4B, and the desired (e.g., flat) phase trajectory 13 can be obtained. Accordingly, in accordance with the embodiment, both of the gain and the phase trajectories can be achieved at the same time without sacrificing one for the other.

As explained with reference to FIG. 1, it is noted that the second envelope shaping unit 140 generates the control signal (i.e., the second modified envelope) according to the envelope shaping function $f_2$ which may refer to the original envelope only. Even assuming that the envelope shaping function $f_2$ may have been defined while referring to another factor, such factor is not received by the second envelope shaping unit. Accordingly, the second envelope shaping unit is capable of determining the value of the control signal from the original envelope $E0_{in}$ without receiving or referring to another value, e.g., the amplified RF signal $RF_{out}$, the supply voltage $V_{sm}$, and/or the first modified envelope $E1_{in}$ while the power amplifying apparatus is functioning. This enhances the rapidity in the generation of the control signal and the phase compensation. Accordingly, unlike the conventional linearization method such as digital pre-distortion (DPD), envelope injection, and dynamic feedback, the present teaching has a potential to cover even wider bandwidth (e.g., 30 MHz or 40 MHz) long-term evolution (LTE) signal.

In addition, it is noted that changing input matching of the impedance matching network by using the phase shifting unit may not impose significant variation of the gain profile of the power amplifying apparatus, since the gain of the supply modulated power amplifier may follow 3 dB or 5 dB compression region which is independent from the input matching network.

Meanwhile, a power amplifying apparatus and a preprocessor module in accordance with another embodiment is explained hereinafter with reference to FIG. 6.

Figure 6:
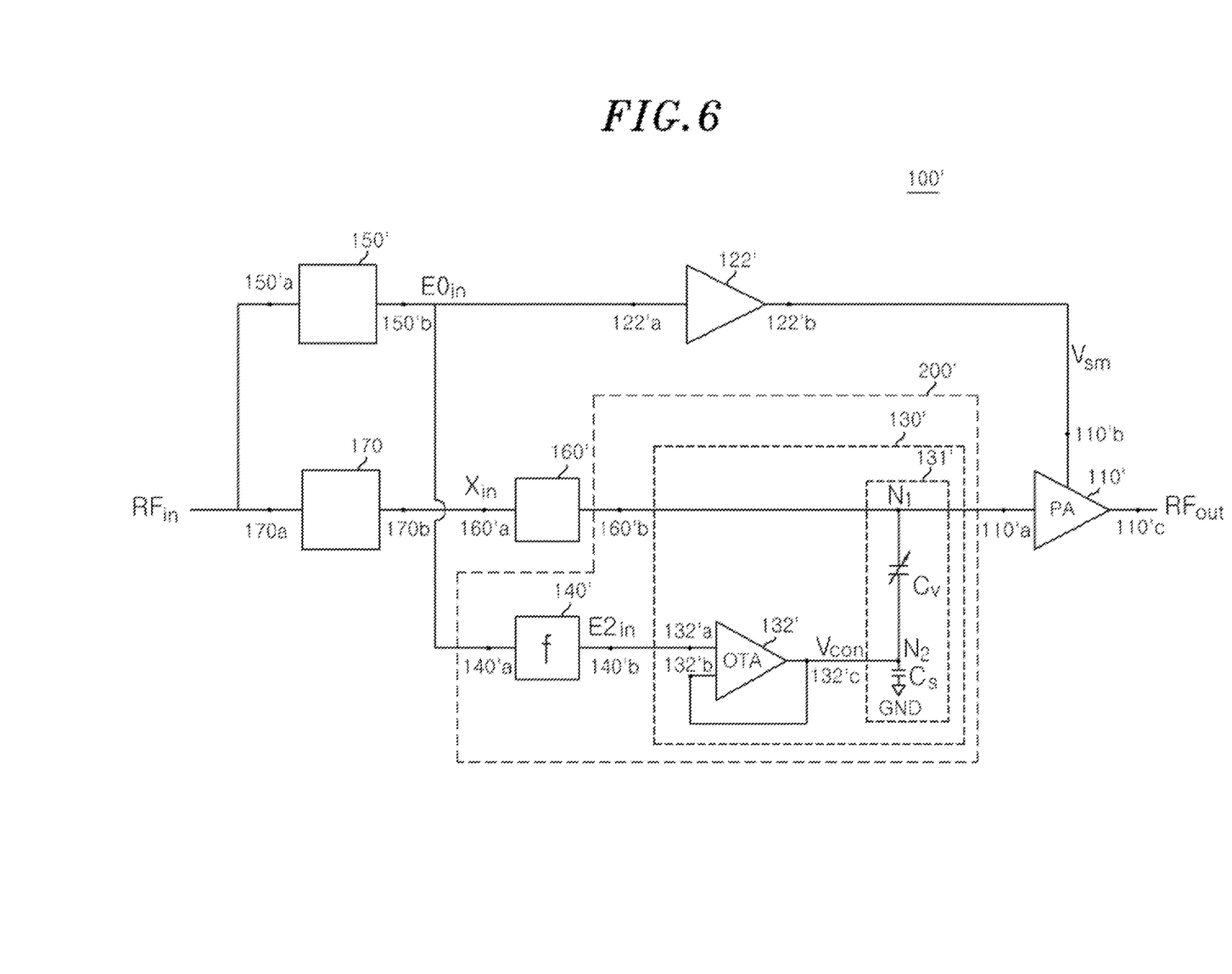
FIG. 6 illustrates the power amplifying apparatus and the preprocessor module in accordance with another embodiment.

FIG. 6 illustrates the power amplifying apparatus and the preprocessor module in accordance with another embodiment.

The power amplifying apparatuses 100 and 100' are different from each other in that the power amplifying apparatus 100' has a structure for operating as the envelop elimination and restoration (EER) amplifier, while the power amplifying apparatus 100 has a structure for operating as the ET power amplifier. Likewise, the preprocessor modules 200 and 200' are different from each other in that the preprocessor module 200 has a structure for the EER amplifier, while the preprocessor module 200' has a structure for the ET power amplifier.

As illustrated in FIG. 6, the power amplifying apparatus 100' may include a radio frequency (RF) power amplifier 110', a supply modulator 122', a phase shifting unit 130', an envelope shaping unit 140', and a limiter 170. The power amplifying apparatus 100' may further include an envelope output unit 150' and/or an impedance matching network 160'.

The RF power amplifier 110', the supply modulator 122', the phase shifting unit 130', the envelope shaping unit 140', the envelope output unit 150', and the impedance matching network 160' shown in FIG. 6 correspond to the RF power amplifier 110, the supply modulator 122, the phase shifting unit 130, the second envelope shaping unit 140, the envelope output unit 150, and the impedance matching network 160 illustrated in FIG. 1, respectively. The configurations and the operations of these elements in FIG. 6 are basically same as those shown in FIG. 1 as explained above.

The limiter 170 has an input port 170a via which the input RF signal $RF_{in}$ is received. An output port 170b of the limiter 170 is electrically connected to the input port of the phase shifting unit 130'. The limiter 170 is configured to eliminate an amplitude component from the input RF signal $RF_{in}$ and to provide an envelope eliminated signal $X_{in}$ which contains a frequency component and a phase component of the input RF signal $RF_{in}$.

Among the elements explained above with reference to FIG. 6, one or more elements may constitute the preprocessor module in accordance with the embodiment. For example, the preprocessor module 200' for an EER amplifier, which may include the RF power amplifier 110', the supply modulator 120', and the limiter 170, may include the phase shifting unit 130' and the envelope shaping unit 140'. The configurations and the operations of these elements in the preprocessor module are basically same as explained above.

It is noted that the power amplifying apparatus 100' and the preprocessor module 200' in accordance with the embodiment may not include an envelope shaping unit for gain shaping such as the first envelope shaping unit 121 in FIG. 1. However, even in this case, the phase trajectory of the overall power amplifying apparatus 100' may still involve the phase distortion. Further, it is still true that the original envelope determine the gain and thus the gain trajectory of the power amplifying apparatus 100'. Accordingly, the envelope shaping unit 140' can adjust the phase delay of the envelope eliminated signal $X_{in}$ according to the original envelope $E0_{in}$ and thereby obtain a desired (e.g. flat) phase trajectory of the power amplifying apparatus 100'. The envelope eliminated signal $X_{in}$ whose phase may be sifted by the phase shifting unit 130' is transmitted to a first input port 110'a of the RF power amplifier 110'.

In view of this disclosure it is noted that various amplifier modules can be implemented in a variety of elements and variant structures. Further, the various elements, structures and parameters are included by way of example only and not in any limiting sense. In view of this disclosure, those skilled in the art can implement the present teachings in determining their own applications and needed elements and equipment to implement these applications, while remaining within the scope of the appended claims.

What is claimed is:

1. A power amplifying apparatus, comprising:
   a radio frequency (RF) power amplifier configured to receive an input RF signal and to output an amplified RF signal;
   a supply modulating unit configured to provide the RF power amplifier with a supply voltage which varies with an original envelope of the input RF signal;
   a phase shifting unit configured to receive a control signal and to shift a phase of the input RF signal to be inputted to the RF power amplifier by a shift amount which varies with the control signal; and
   an envelope shaping unit configured to receive the original envelope and to provide the phase shifting unit with the control signal which varies with the original envelope, the phase shifting unit comprising: a variable phase delayer configured to delay the phase of the input RF signal; and an operational transconductance amplifier (OTA) including an input port and an output port, the OTA being configured to receive the control signal from the envelope shaping unit via the input port and to provide the variable phase delayer with a control voltage.

2. The power amplifying apparatus of claim 1, wherein the envelope shaping unit is configured to generate the control signal independently from the amplified RF signal and the supply voltage.

3. The power amplifying apparatus of claim 1, wherein the envelope shaping unit includes a mapping table which stores a plurality of control signal values respectively corresponding to a plurality of envelope values.

4. The power amplifying apparatus of claim 1, wherein the envelope shaping unit includes a calculator which is configured to generate the control signal based on the original envelope and a preset formula.

5. The power amplifying apparatus of claim 1, wherein the envelope shaping unit is a signal generator.

6. The power amplifying apparatus of claim 1, wherein the supply modulating unit includes:
   an additional envelope shaping unit configured to modify the original envelope and to output a modified envelope; and
   a supply modulator configured to receive the modified envelope and to output the supply voltage.

7. The power amplifying apparatus of claim 6, wherein the additional envelope shaping unit is configured to obtain the modified envelope by detroughing the original envelope.

8. The power amplifying apparatus of claim 6, wherein the additional envelope shaping unit is a signal generator.

9. The power amplifying apparatus of claim 6, wherein the envelope shaping unit is configured to generate the control signal independently from the modified envelope generated by the additional envelope shaping unit.

10. The power amplifying apparatus of claim 1, wherein the OTA further includes an additional input port which is electrically connected to the output port of the OTA.

11. The power amplifying apparatus of claim 1, wherein the variable phase delayer includes:
    a first node via which the input RF signal is transmitted;
    a second node via which the control voltage is transmitted;
    a varactor connected between the first node and the second node, the varactor having a capacitance which varies with the control voltage; and
    an RF bypass capacitor connected between the second node and a ground.

12. A preprocessor module for an envelope tracking (ET) power amplifier which includes a radio frequency (RF) power amplifier and a supply modulator, the preprocessor module comprising:
    a first envelope shaping unit configured to generate a first modified envelope from an original envelope of an input RF signal to be inputted to the RF power amplifier and providing the supply modulator with the first modified envelope, the first modified envelope being generated such that the ET power amplifier has a preset gain trajectory;
    a phase shifting unit configured to receive a control signal and to shift a phase of the input RF signal to be inputted to the RF power amplifier by a shift amount which varies with the control signal, wherein the control signal comprises the first modified envelope; and
    a second envelope shaping unit configured to generate a second modified envelope from the original envelope, and to provide the phase shifting unit with the second modified envelope, wherein the shift amount varies with the second modified envelope, wherein the second modified envelope is generated such that the ET power amplifier has a preset phase trajectory, and wherein the second envelope shaping unit is configured to generate the second modified envelope independently from the first modified envelope.

13. The preprocessor module of claim 12, wherein the second envelope shaping unit is configured to generate the second modified envelope independently from an amplified RF signal which is outputted from the RF power amplifier.

14. The preprocessor module of claim 12, wherein the second envelope shaping unit includes a mapping table which stores a plurality of modified envelope values respectively corresponding to a plurality of original envelope values.

15. The preprocessor module of claim 12, wherein the second envelope shaping unit includes a calculator which is configured to generate the second modified envelope based on the original envelope and a preset formula.

16. The preprocessor module of claim 12, wherein the second envelope shaping unit is a signal generator.

17. A preprocessor module for an envelope elimination and restoration (EER) amplifier which includes a radio frequency (RF) power amplifier and a supply modulator, the preprocessor module comprising:

a phase shifting unit configured to shift an input RF signal to be inputted to the RF power amplifier by a shift amount; and an envelope shaping unit configured to generate a modified envelope from an original envelope of the input RF signal, and to provide the phase shifting unit with the modified envelope, the envelope shaping unit comprising a mapping table, which stores a plurality of modified envelope values respectively corresponding to a plurality of original envelope values, wherein the shift amount varies with the modified envelope, wherein the modified envelope is generated such that the EER amplifier has a preset phase trajectory, and wherein the envelope shaping unit is configured to generate the modified envelope independently from an amplified RF signal which is outputted from the RF power amplifier.

18. The preprocessor module of claim 17, wherein the envelope shaping unit includes a calculator which is configured to generate the modified envelope based on the original envelope and a preset formula.

* * * * *